(12) United States Patent
Yamane

(10) Patent No.: US 6,522,528 B2
(45) Date of Patent: Feb. 18, 2003

(54) ELECTRIC POWER DISTRIBUTOR FOR USE IN MOTOR VEHICLE

(75) Inventor: Shigeki Yamane, Nagoya (JP)

(73) Assignees: Autonetworks Technologies, Ltd., Aichi (JP); Sumitomo Wiring Systems, Ltd., Mie (JP); Sumitomo Electric Industries, Ltd., Osaka (JP)

(*) Notice: Subject to any disclaimer, the term of this patent is extended or adjusted under 35 U.S.C. 154(b) by 0 days.

(21) Appl. No.: 10/104,032

(22) Filed: Mar. 25, 2002

(65) Prior Publication Data

US 2002/0141143 A1 Oct. 3, 2002

(30) Foreign Application Priority Data

Mar. 30, 2001 (JP) ........................................ 2001-101094

(51) Int. Cl.[7] ................................................. G06F 1/16
(52) U.S. Cl. ........................ 361/601; 361/676; 361/730
(58) Field of Search .................................. 361/676, 730, 361/601

(56) References Cited

U.S. PATENT DOCUMENTS 4,498,120 A * 2/1985 Kaufman .................... 361/386
2001/0026430 A1 * 10/2001 Onizoka et al. ............. 361/103

FOREIGN PATENT DOCUMENTS

| JP | A 10-126963 | 5/1998 |
| JP | A 10-150283 | 6/1998 |

* cited by examiner

Primary Examiner—Darren Schuberg
Assistant Examiner—Yean-Hsi Chang
(74) Attorney, Agent, or Firm—Oliff & Berridge, PLC

(57) ABSTRACT

An electric power distributor mountable on a motor vehicle for distributing power from a power source installed in the motor vehicle to a plurality of electric load units equipped in the vehicle has a plurality of semiconductor operative elements which are incorporated in a power supply circuit from the power source to the electric load units; a control circuit board incorporated with a control circuit for controlling an operation of the semiconductor operative elements; a housing for encasing the semiconductor operative elements and the control circuit board therein; and a heat releasing member provided on an outer surface of the housing to release heat transferred from the semiconductor operative elements outside of the housing. The control circuit board is arranged at such a position as to be mounted over the semiconductor operative elements from a side of the housing opposite to the mounted side of the heat releasing member with respect to the semiconductor operative elements, and is formed with a heat transfer layer on a side of the control circuit board as opposed to the semiconductor operative elements. The heat transfer layer and the heat releasing member are connected by a heat transfer member.

9 Claims, 4 Drawing Sheets

ELECTRIC POWER DISTRIBUTOR FOR USE IN MOTOR VEHICLE

BACKGROUND OF THE INVENTION

1. Field of the Invention

This invention relates to an electric power distributor for use in a motor vehicle adapted to distribute electric power supplied from a power source such as a battery incorporated in the motor vehicle to a plurality of electric load units equipped in the motor vehicle.

2. Description of the Related Art

Heretofore, there has been known an electric connecting box, as a device for distributing electric power supplied from a power source incorporated in a motor vehicle to a plurality of electric load units equipped in the vehicle. The electric connecting box is constructed in such a manner that a number of substrates each mounted with a bus bar are placed one over another to form a distributing circuit, and various elements such as a fuse and a relay switch are provided on the circuit.

Recently, an electric power distributor has been developed to make such an electric connecting box smaller and to accomplish a high-speeding switching control. Such an electric power distributor has an arrangement in which semiconductor switching elements such as field effect transistors (FETs) are provided between input terminals and output terminals of the power distributor in place of a relay switch to allow a control circuit of a control circuit board to control on and off of electric current supply.

For instance, Japanese Unexamined Patent Publication No. 10-126963 discloses an arrangement of such a power distributor in which a plurality of semiconductor switching elements or chips are mounted on a control circuit board, current on/off control terminals or control signal input terminals of the semiconductor switching elements are connected to a control circuit of the circuit board, input terminals provided at an appropriate position of the respective semiconductor switching elements for supplying electric current are connected to a power source via a common input terminal connected to the power source whereas output terminals provided at an appropriate position of the respective semiconductor switching elements for outputting power are connected to respective electric load units via output terminals connected to the power source.

In the arrangement of the above publication, the semiconductor switching elements are mounted on the control circuit board. This arrangement makes it difficult to release heat of the semiconductor switching elements, namely, to cool the semiconductor switching elements. In a worse case, it is highly likely that other circuit elements on the same control circuit board may be subjected to adverse affect of the heated semiconductor switching elements. Particularly, in an electric power distributor in which semiconductor switching elements are arranged on a power supply circuit connecting a power source and electric load units, a large amount of heat is expected to generate from the semiconductor switching elements. Mounting such semiconductor switching elements on the control circuit board without any measures is not desirable as mentioned above.

As means for eliminating the above drawback, there has been proposed an arrangement as disclosed in, e.g., Japanese Unexamined Patent Publication No. 10-150283. This publication discloses that each semiconductor switching element are disposed away from a control circuit board in a housing and that the semiconductor switching elements and the control circuit board are electrically connected by connecting means. Each semiconductor switching element are connected to a metallic heat releasing member provided on an outer surface of the housing in such a manner that heat of the semiconductor switching elements is transferable to the heat releasing member, whereby the heat of the semiconductor switching elements is released outside of the housing.

The above arrangement, however, fails to effectively suppress a rise of an ambient temperature in the housing in the case where the air inside the housing is heated resulting from the heated semiconductor switching elements, although the arrangement is effective in lowering the temperature of the semiconductor switching elements themselves by the heat releasing member to some extent. In particular, in an electric power distributor for use in a motor vehicle, the parts are sealably accommodated in the housing to prevent intrusion of rainwater and the like. Therefore, heat inside the housing is not easily released outside once heat is generated in the housing. It is highly likely that a rise of an ambient temperature in the housing may adversely affect performance of other electronic devices, especially, a device of a low heat resistance, in the housing.

SUMMARY OF THE INVENTION

It is an object of the present invention to provide an electric power distributor for use in a motor vehicle that is free from the problems residing in the prior art.

It is another object of the present invention to provide an electric power distributor for use in a motor vehicle that enables to suppress a rise of an ambient temperature in a housing with a simplified construction while cooling semiconductor operative elements.

According to an aspect of the present invention, an electric power distributor mountable on a motor vehicle for distributing power from a power source installed in the motor vehicle to a plurality of electric load units equipped in the vehicle comprises: a plurality of semiconductor operative elements which are incorporated in a power supply circuit from the power source to the electric load units; a control circuit board incorporated with a control circuit for controlling an operation of the semiconductor operative elements; a housing for accommodating the semiconductor operative elements and the control circuit board; and a heat releasing member provided on an outside of the housing to release heat from an inside of the housing to an outside of the housing. The control circuit board is arranged over the semiconductor operative elements, and is formed with a heat transfer layer on a surface of the control circuit board that faces the semiconductor operative elements. The heat transfer layer and the heat releasing member are connected with each other by a heat transfer member.

These and other objects, features and advantages of the present invention will become more apparent upon a reading of the following detailed description and accompanying drawing.

DETAILED DESCRIPTION OF THE PREFERRED EMBODIMENTS OF THE INVENTION

A preferred embodiment of the invention is described with reference to the accompanying drawings. First, a circuit configuration of an electric power distributor for use in a motor vehicle according to an embodiment of this invention is described with reference to FIG. 1.

Figure 1:
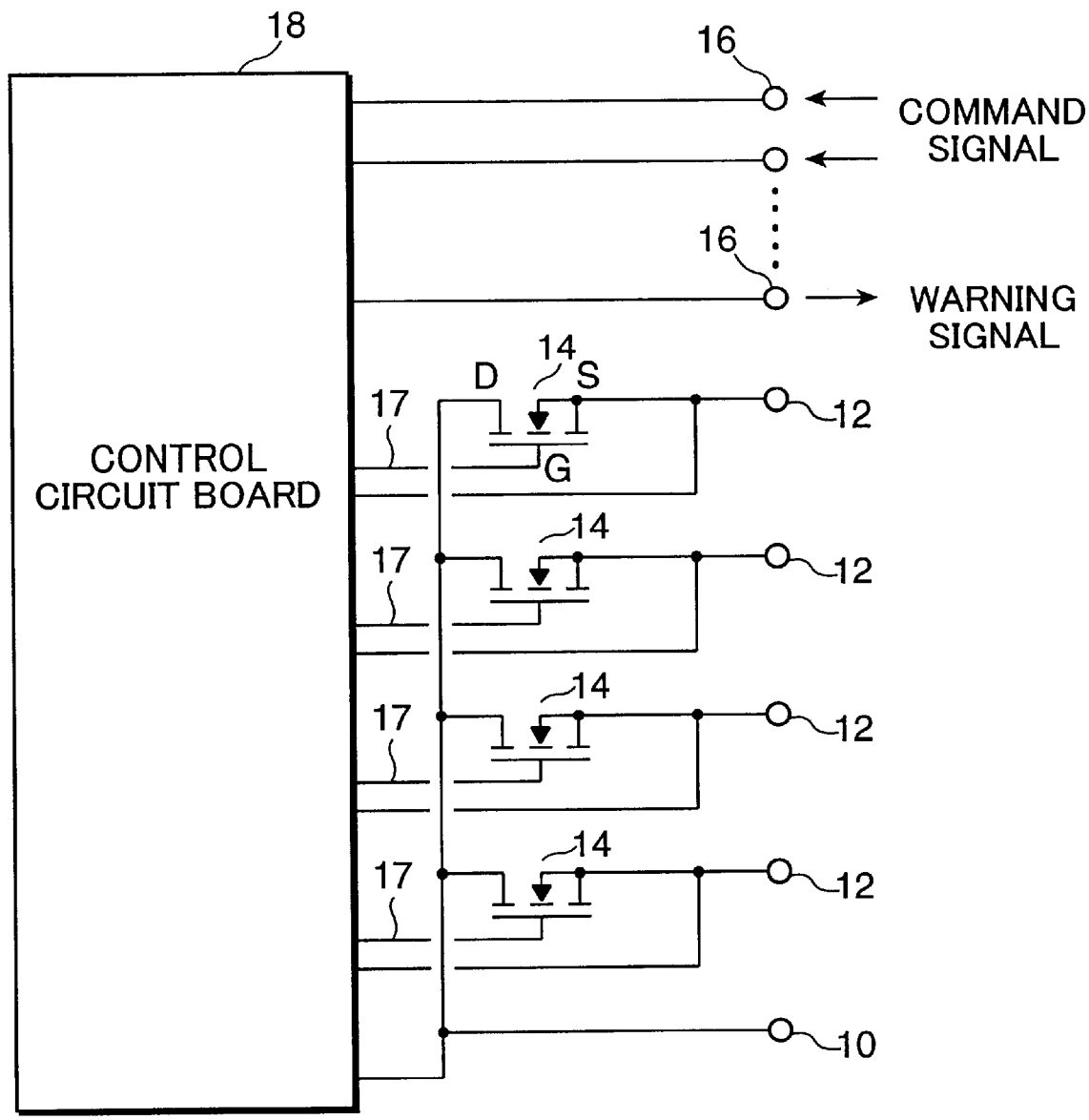
FIG. 1 is a circuit diagram of an electric power distributor according to an embodiment of this invention.

The power distributor comprises one input terminal 10 connected to a battery of the motor vehicle, and a number of output terminals 12 (in FIG. 1, four output terminals). Semiconductor switching elements or semiconductor operative elements 14 (in FIG. 1, power MOSFETs, hereafter simply referred to as "FETs") are provided each between the corresponding output terminal 12 and the input terminal 10. Specifically, a drain D of each FET 14 serving as an input terminal is connected to the input terminal 10, and a source S thereof serving as an output terminal is connected to the corresponding one of the output terminals 12.

A gate G of each FET 14 is connected to a control circuit on a control circuit board 18. In this embodiment, a power voltage to be applied to the input terminal 10 and a source voltage of each FET 14 are input to the control circuit.

Upon receiving operation signals (switching command signal) through terminals 16 of the control circuit board 18 (hereinafter, referred to as "board terminal 16"), the control circuit of the control circuit board 18 outputs a control signal to the gate G of each FET 14 through a control terminal 17, thereby controlling electric current supply to the FETs 14. Also, the control circuit calculates a current running in the target FET 14 based on a difference in potential between the power source voltage and a source voltage of the FET 14, and turns the FET 14 off if it is determined that the current running in the FET 14 exceeds an allowable range. Simultaneously, the control circuit outputs a warning signal to an unillustrated display device through a board terminal 16.

It should be appreciated that the configuration of the control circuit to be incorporated in the control circuit board 18 is not limited to the above.

Next, an exemplary construction of the electric power distributor according to this embodiment is described with reference to FIGS. 2 through 4.

Figure 2:
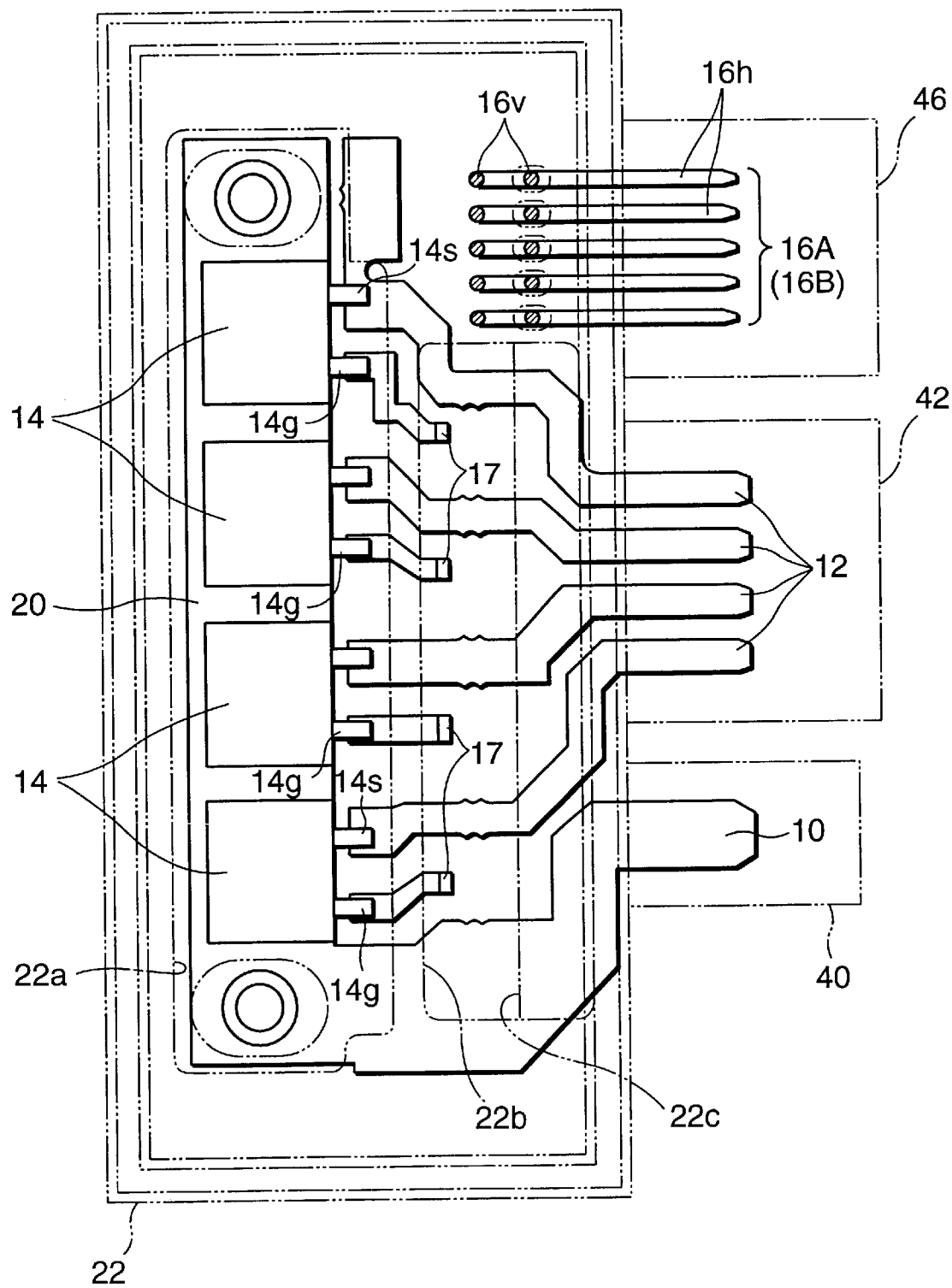
FIG. 2 is a plan view of the electric power distributor in a state that a housing of the electric power distributor is omitted.

As shown in FIG. 2, the input terminal 10 and the output terminals 12 each having a generally strip-like shape are arrayed in a line in a vertical direction in FIG. 2 and extend in the same direction (rightward direction in FIG. 2). Further, the strip-like control terminals 17 are provided each extending generally in the same direction as the output terminals 12. The control terminals 17 and the output terminals 12 are arrayed alternately. The input terminal 10 is arranged outside of the group of the control terminals 17 and the output terminals 12 (lower side in FIG. 2).

The power distributor includes a drain connecting member or conductive plate 20 extending in the arrayed direction of the terminals 10, 12, 17 at a rear side thereof (left side in FIG. 2). The drain connecting member 20 and the input terminal 10 are made of a single metallic plate. Specifically, the input terminal 10, the output terminals 12, and the control terminals 17 are arrayed in the extending direction of the drain connecting member 20 in a state that the terminals 10, 12, 17 each extend from a right side portion of the drain connecting member 20 in FIG. 2. The drain connecting member 20 and the input terminal 10 are made integral. The FETs 14 are arrayed in the extending direction of the drain connecting member 20, namely, in the arrayed direction of the terminals 10, 12, 17, and mounted on the drain connecting member 20.

Indicated at 14d (see FIG. 4) is a drain port of the drain D of each FET 14. The drain port 14d serves as an input port, and is, as shown in FIG. 4, exposed on the backside surface of a main body of the FET 14. Indicated at 14s is a source port of the source S of the FET 14, and indicated at 14g is a gate port of the gate G of the FET 14. The source port 14s serves as an output port, and the gate port 14g serves as a port for controlling current supply. As shown in FIG. 2, the source port 14s and the gate port 14g are projected from the same side (right side in FIG. 2) of the main body of the FET 14. The FETs 14 are arrayed on the drain connecting member 20 with the same arrangement and at the same pitch as the arrangement and the pitch of the output terminals 12 and the control terminals 17. The FETs 14 are mounted on the drain connecting member 20 by welding (e.g., soldering) or its equivalent in a state that the drain ports 14d of the FETs 14 are in direct contact with the drain connecting member 20. The source ports 14s and the gate ports 14g of the FETs 14 are electrically connected to rear ends of the corresponding output terminals 12 and the control terminals 17 respectively by welding means such as soldering.

The power distributor according to this embodiment can be fabricated, for example, according to the following process. Specifically, a metallic plate is punched into a shape having the terminals 10, 12, 17 and the drain connecting member 20 connected with one another at small joints. After placing the punched metallic plate in a die, a resin is fed into the die and molded to obtain a resin mold. After forming the resin mold, the joints are cut to thereby produce a housing having metallic plates. This housing is usable as a housing 22 of the electric power distributor.

As shown in FIG. 2, the housing 22 is formed with an opening 22a through which an operator is accessible to the drain connecting member 20 and with an opening 22b through which the operator is accessible to intermediate parts of the output terminals 12 and the control terminals 17. The operator can remove the joints of the metallic plate through the openings 22a, 22b, and also can mount the FETs 14 in an upper space above the drain connecting member 20 through the opening 22a.

Figure 4:
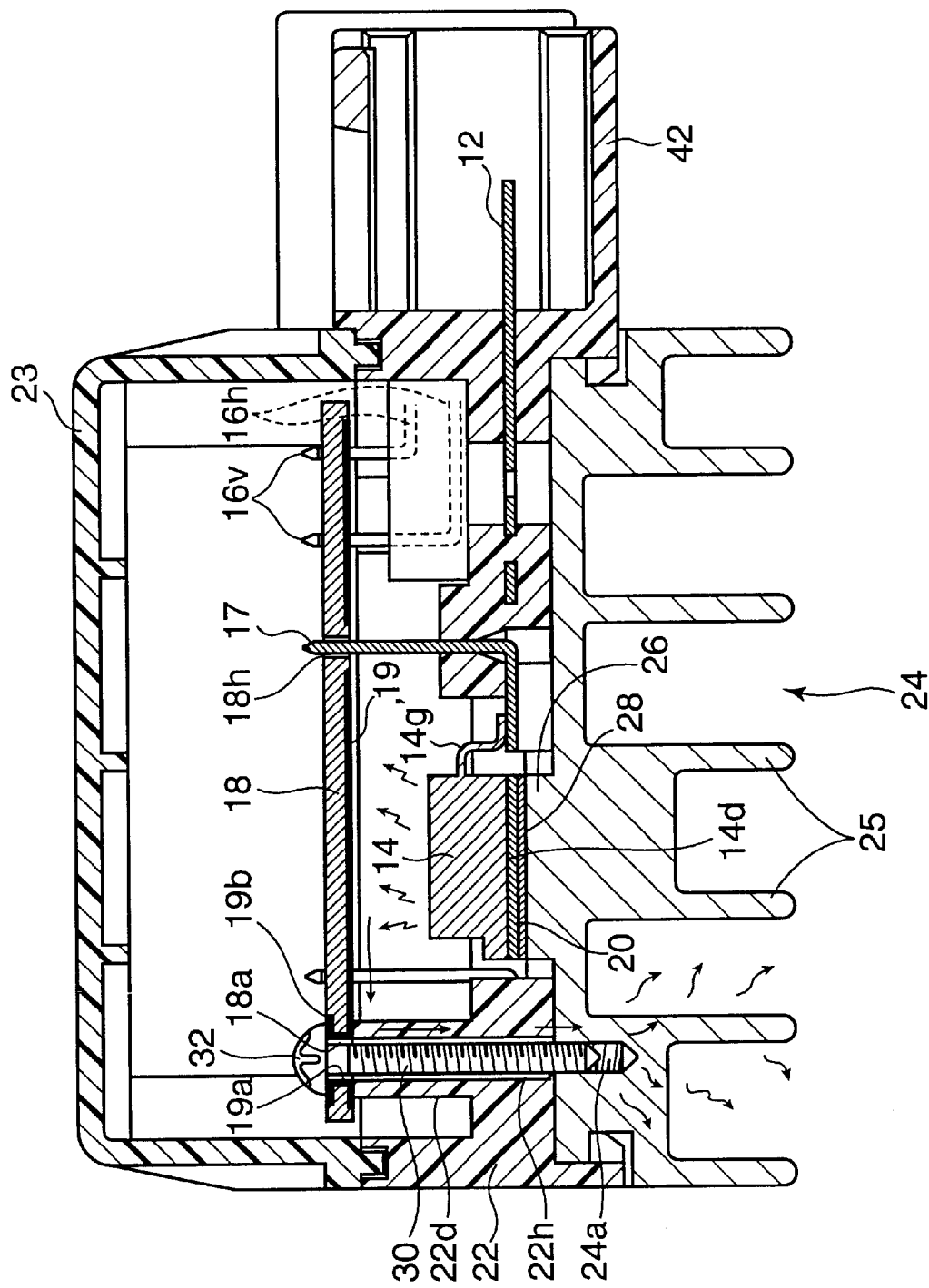
FIG. 4 is a sectional side view of the electric power distributor.

As shown in FIG. 4, a part of the input terminal 10 and the output terminals 12 are projected through a side wall of the housing 22 horizontally outwardly therefrom. Each of the control terminals 17 are bent into an L-shape such that an upper half portion thereof is oriented upward.

A heat releasing member 24 is mounted over the entirety of a backside surface of the housing 22.

The heat releasing member 24 is made of a material having a high thermal conductivity or a high specific heat such as aluminum alloy or copper alloy. A number of fins 25 extending parallel to each other are integrally formed on a backside surface of the heat releasing member 24, that is, on a surface exposing outside of the power distributor.

The heat releasing member 24 includes a block portion 26 extending in the same direction as the arrayed direction of the FETs 14 and projecting upward on an upper surface of the heat releasing member 24. The drain connecting member 20 is mounted on the block portion 26 in such a manner that the backside surface of the drain connecting member 20 is electrically insulated from and rendered in heat transferable state to an upper surface of the block portion 26 by way of an insulating sheet 28 made of a silicone or the like.

The terminals 10, 12, 17, and the FETs 14 are not necessarily arranged on the same plane. Alternatively, these members may be arranged vertically stepwise group by group. However, arranging these members substantially on the same plane enables to produce a power distributor of a small size. Further, integrally assembling these members according to resin molding enables to produce a power distributor having a simplified structure and feasible in handling.

A number of board terminals 16 constituted of upper board terminals 16A and lower board terminals 16B are provided on a side portion of the input terminal 10 and the output terminals 12 in such a manner that the upper board terminals 16A and the lower board terminals 16B are vertically away from each other to connect the control circuit board 18 to an external circuit or a circuit provided outside of the power distributor. The upper and lower board terminals 16A, 16B are integrally molded together with the housing 22.

Each of the upper (lower) board terminals 16A (16B) is obtained by bending an intermediate portion of a metallic pin at a generally right angle. As shown in FIG. 4, each board terminal 16A (16B) includes a horizontal portion 16*h* and a vertical portion 16*v*. The horizontal portion 16*h* and the vertical portion 16*v* are made integral into an L-shape in side view. The horizontal portion 16*h* and the vertical portion 16*v* are molded to the housing 22 in such a manner that the horizontal portion 16*h* projects horizontally in a sideways direction through the side wall of the housing 22 and that the vertical portion 16*v* projects upwardly through a top wall of the housing 22.

Figure 3:
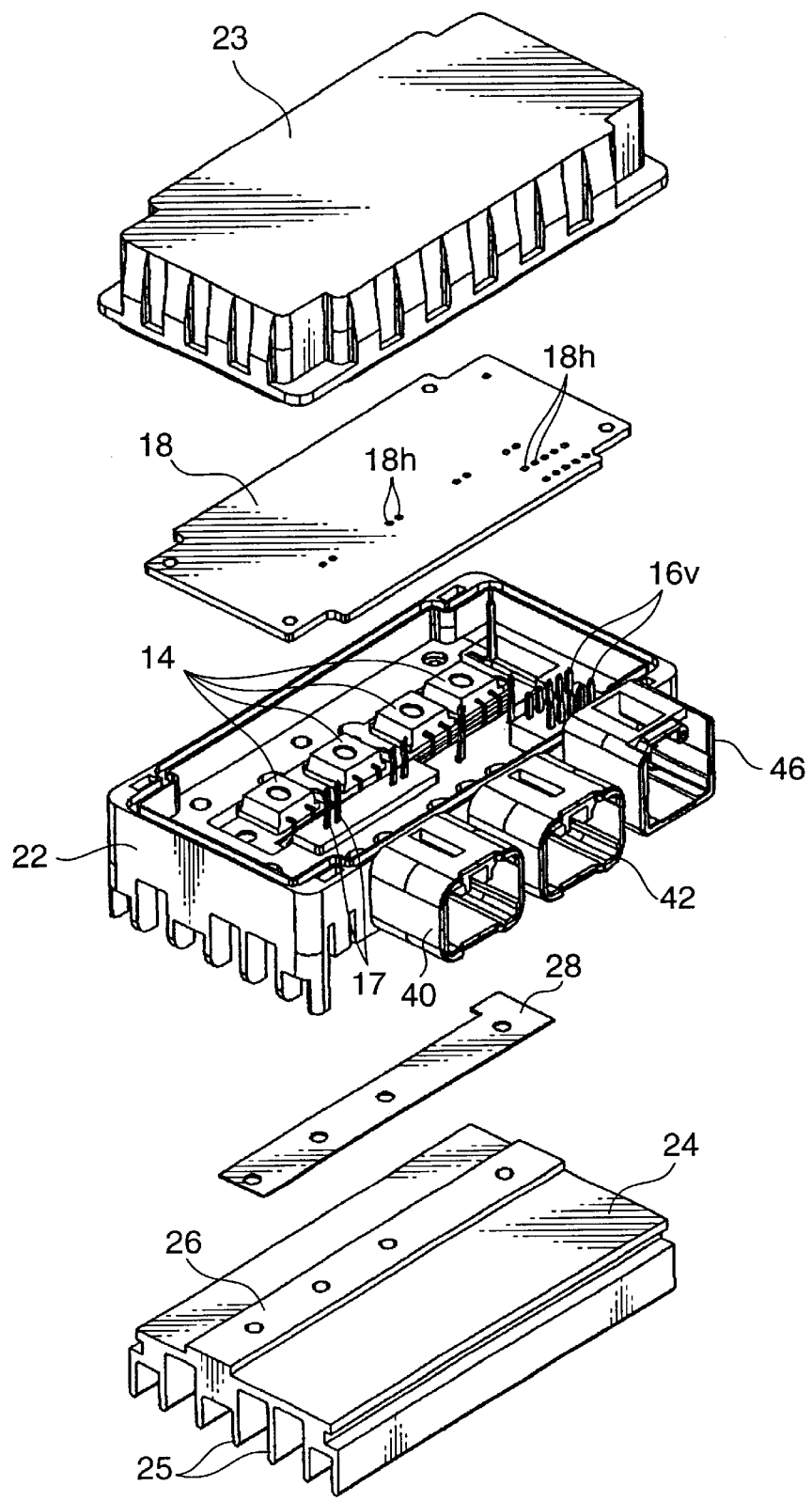
FIG. 3 is an explosive perspective view of the electric power distributor.

As shown in FIGS. 2 and 3, the housing 22 is integrally formed with an input terminal housing portion 40, an output terminal housing portion 42, and a board terminal housing portion 46 at an outer portion on a sidewall of the housing 22. The input terminal housing portion 40 houses the projected portion of the input terminal 10, the output terminal housing portion 42 houses the projected portions of all the output terminals 12, and the board terminal housing portion 46 houses the projected portions of the horizontal portions 16*h* of all the board terminals 16. Connecting a housing of a connector of a wire harness to be connected to a power source of a motor vehicle to the input terminal housing portion 40 enables to connect the input terminal 10 to the power source via the powersource-side wire harness. Likewise, connecting a housing of a connector of a wire harness to be connected to electric load units of the motor vehicle to the output terminal housing portion 42 enables to connect the output terminals 12 to the respective electric load units via the load-side wire harness. Likewise, connecting a housing of a connector of a wire harness to be connected to the control circuit board 18 to the board terminal connector housing portion 46 enables to connect the board terminals 16 to an external circuit or a circuit for outputting a command signal to the control circuit board 18 and a circuit for receiving a warning signal from the control circuit board 18 for displaying an alert on a display device via the board-side wire harness.

More specifically, the projected portion of the input terminal 10, the projected portions of the output terminals 12, and the projected portions of the horizontal portions 16*h* of the board terminals 16 which are projected outside of the housing 22 constitute a connector for input, a connector for output, and a connector for the control circuit board 18, respectively.

The control circuit board 18 is fixedly mounted to the housing 22 in such a manner that the control circuit board 18 is arranged above the FETs 14 and substantially in parallel to the plane on which the FETs 14 are mounted (in FIG. 4, in a substantially horizontal state). More specifically, the control circuit board 18 is arranged at such a position as to cover the FETs 14 from above by a certain distance away therefrom in FIG. 4, namely, on a side of the housing 22 opposite to the side where the heat releasing member 24 is provided. The control circuit board 18 and the heat releasing member 24 are mounted generally in parallel to the plane where the FETs 14 are mounted.

The control circuit board 18 is formed with a number of through-holes 18*h* in a thickness direction thereof The board terminals 16 and the control terminals 17 are electrically connected to the control circuit of the control circuit board 18 by welding means such as soldering and fixedly attached thereto by inserting the vertical portions 16*v* of the board terminals 16 and the control terminals 17 in the through-holes 18*h*.

It should be appreciated that in FIG. 2, terminals for connecting the input terminal 10 and the output terminals 12 to the control circuit board 18 are not shown.

Next, a construction as to how the control circuit board 18 is fixedly mounted to the housing 22 is described with reference to FIG. 4. First, there are provided a number of board support pins 22*d* extending upward from a bottom wall of the housing 22. Bolt insertion holes 22*h* are formed in the housing 22 having a length substantially covering the full length of the board support pin 22*d* and through the bottom wall of the housing 22. Bolt insertion holes 18*a* are formed in the control circuit board 18 at positions corresponding to the bolt insertion holes 22*h*. Threaded holes 24*a* opening upward are formed in the heat releasing member 24 at positions corresponding to the bolt insertion holes 22*h*. Fittingly inserting a metallic bolt (heat transfer member) 30 into each bolt insertion hole 18*a* of the control circuit board 18 and through the corresponding bolt insertion hole 22*h* of the housing 22 and screwing the metallic bolt 30 into the corresponding threaded hole 24*a* of the heat releasing member 24 enables to fixedly mount the control circuit board 18 in the housing 22 substantially in a horizontal state while being supported by the board support pins 22*d*. Thus, a certain space is secured between the lower surface of the control circuit board 18 and the FETs 14.

Furthermore, the electric power distributor according to this embodiment has a feature that a heat transfer layer 19 made of a material having a high heat transfer rate such as a plated layer is formed substantially over the entirety of the lower surface of the control circuit board 18, namely, on the side of the control circuit board 18 opposing the FETs 14. The heat transfer layer 19 includes an inner side extension 19*a* that is attached to an inner surface of the bolt insertion hole 18*a*, and an upper peripheral extension 19*b* that is attached to an upper peripheral end of the bolt insertion hole 18*a*. The upper peripheral extension 19*b* of the heat transfer layer 19 is rendered in contact with a bottom surface of a head portion 32 of the bolt 30.

An upper opening of the housing 22 is covered with a cover member 23. The cover member 23 sealably covers the parts inside the housing 22.

Next, an operation of the electric power distributor according to this embodiment is described.

An electric power from a battery (not shown) loaded in a motor vehicle is supplied to the input terminal 10 via the power-side wire harness and is distributed to the drain ports 14*d* of the FETs 14. Among the electric currents distributed at the drain ports 14*d* of the FETs 14, an electric current that has been input to the drain port 14d of the FET 14 in an ON-state is supplied to the corresponding load unit via the corresponding output terminal 12 and the load-side wire harness.

Simultaneously, an operation signal (e.g., switching command signal) transmitted from the external circuit is input to the control circuit of the control circuit board 18 via the board-side wire harness and the corresponding board terminal 16. Upon receiving the operation signal the control circuit outputs a control signal to the gate port 14g of each FET 14 by way of the corresponding control terminal 17 to control on/off of electric current supply between the drain port 14d and the source port 14s of the FET 14 that has received the control signal. Upon changeover of the FET 14 from the ON-state to an OFF-state, current supply to the output terminal 12 connected to the source port 14s of the FET 14 in the OFF-state is suspended.

An electric current of a certain potential at the input terminal 10 and the output terminals 12 is supplied to the control circuit. Upon receiving the electric currents, the control circuit calculates a current value running through each FET 14 based on a difference in potential between the input terminal 10 and corresponding output terminal 12. If it is judged that the current value exceeds a certain range, the control circuit suspends current supply to the FET 14 at which over-current supply has been detected.

Turning on and off of the FETs (semiconductor switching elements) 14 causes a remarkable amount of heat generation. However, in the electric power distributor according to this embodiment, since the FETs 14 are arranged independently away from the control circuit board 18, the arrangement of the electric power distributor keeps the heat generated from the FETs 14 to adversely affect the other circuit elements on the control circuit board 18. Further, the heat of the FETs 14 can be transferred to the heat releasing member 24 by way of the drain connecting member 20 and the insulating sheet 28 to release the heat outside of the housing 22 through the heat releasing member 24. Thus, this arrangement enables positive cooling of the FETs 14.

There is a case, however, that such an arrangement may result in convection heating of the air above the FETs 14 due to heating of the FETs 14 inside the housing 22. To prevent such a drawback, the electric power distributor according to this embodiment is constructed in such a manner that the heat transfer layer 19 is formed on the backside surface of the control circuit board 18 having such an area as to substantially cover all the FETs 14 and that heat of the heat transfer layer 19 is transferable to the heat releasing member 24 by the metallic bolt 30 for fixing the control circuit board 18 on the housing 22. This arrangement enables to collect the heat in the air inside the housing 22 and to positively discharge the heat outside of the housing 22 by way of the bolt 30 and the heat releasing member 24. This arrangement enables to suppress a rise of an ambient temperature in the housing 22 and to keep the performance of the other electronic devices or elements from being adversely affected by the resultant temperature rise.

In other words, the electric power distributor according to this embodiment enables to effectively suppress a rise of an ambient temperature in the housing 22 with a simplified construction by utilizing the control circuit board 18 provided for on/off control of the FETs 14.

This invention is not limited to the above embodiment, and the following modifications and alterations may be made according to this invention, as far as such modifications and alterations do not depart from the gist of this invention.

The semiconductor switching element used in this invention includes, in addition to a power MOSFET, a variety of kinds of semiconductor elements having a switching function such as other types of transistors including insulated gate bipolar transistors (IGBTs) and bipolar transistors, and various types of thyristors including gate turn-off thyristors (GTO) according to demands of specifications of a motor vehicle in which the power distributor is used. Such a semiconductor switching element is not limited to a packaged device. For instance, a semiconductor chip may directly be mounted on a substrate. A manner as to how the semiconductor switching element is bonded to each terminal is not specifically limited. For instance, a wire may be used at an appropriate position for bonding the semiconductor switching element and each terminal.

According to the invention, the number and arrangement of the semiconductor switching elements and the output terminals are optimally selectable depending on the arranged position and the number of electrical equipment installed in a motor vehicle.

In the foregoing embodiment, a bolt for fixing the control circuit board on the housing is used as a heat transfer member for making the heat transfer layer 19 and the heat releasing member 24 in a heat transferable state. Alternatively, a dedicated heat transfer member may be provided in addition to the bolt.

It is not necessary to form the heat transfer layer 19 over the entirety of the surface of the control circuit board. For instance, in the case where FETs 14 are arranged centrally, a heat transfer layer may be formed locally in the vicinity of the FETs 14. Alternatively, part of a lower side on the heat transfer layer 19 may be rendered in direct contact with the bolt 30 in place of the arrangement as shown in FIG. 4 in which the heat transfer layer 19 covers the inner peripheral surface of the bolt insertion hole 19a and the upper peripheral end thereof (namely, contact surface with the bolt head portion 32).

As described above, an electric power distributor is mountable on a motor vehicle and adapted for distributing power from a power source installed in the motor vehicle to a plurality of electric load units equipped in the vehicle. The power distributor comprises: a plurality of semiconductor operative elements which are incorporated in a power supply circuit from the power source to the electric load units; a control circuit board incorporated with a control circuit for controlling an operation of the semiconductor switching elements; a housing for accommodating the semiconductor operative elements and the control circuit board therein; and a heat releasing member provided on an outer surface of the housing to release heat outside of the housing. The control circuit board is arranged over the semiconductor switching elements, and formed with a heat transfer layer on the surface of the control circuit board that faces the semiconductor operative elements. The heat transfer layer and the heat releasing member are connected by a heat transfer member. Also, it may be preferable to arrange the control circuit board and the heat releasing member on the opposite sides of the semiconductor operative elements, respectively.

With this arrangement, independently arranging the semiconductor switching elements and the control circuit board away from each other enables to effectively discharge heat generated from the semiconductor switching elements outside of the housing by the heat releasing member provided on the outer surface of the housing while suppressing a rise of a temperature of the control circuit board itself.

In the above arrangement, the control circuit board is arranged at such a position as to be mounted over the semiconductor switching elements from the side opposite to the mounted side of the heat releasing member, and the heat transfer layer is formed to the surface of the control circuit board as opposed to the semiconductor switching elements. Thereby, heat in the air inside the space defined by the control circuit board and the semiconductor switching elements is transferred to the heat releasing member by heat transfer means composed of the heat transfer layer and the heat transfer member, and is discharged outside of the housing. In other words, this arrangement enables to suppress a rise of an ambient temperature inside the casing resulting from heat generation in the semiconductor switching elements with a simplified construction by utilizing the control circuit board in the housing.

The heat transfer layer and the heat transfer member may be made of a material having a high thermal conductivity than a material (generally a synthetic resin) composing the housing and the circuit board main body. Preferably, a metal having a high thermal conductivity such as aluminum and copper may be suitable.

The location of the semiconductor switching elements, the heat releasing member, and the control circuit board is not limited. However, it is preferable to arrange the semiconductor switching elements substantially on the same plane and to arrange the heat releasing member and the control circuit board substantially in parallel to this plane. With this arrangement, the heat releasing member enables to cool the semiconductor switching elements uniformly and efficiently. Further, this arrangement enables to collect heat in the housing by way of the heat transfer layer on the control circuit board.

Preferably, the heat transfer member may be provided independently of the other parts. However, it is possible to use a metallic bolt member for fixedly mounting the control circuit board in the housing as such a heat transfer member. This arrangement enables to simplify the construction of the power distributor. In this case, the bolt member is rendered in contact with the heat transfer layer and the heat releasing member.

The bolt member is passed through a bolt insertion hole formed in the control circuit board and through the housing to be connected to the heat releasing member. This arrangement enables to allow the bolt member serving as heat transfer means to effectively transfer heat in the heat transfer layer on the control circuit board to the heat releasing member provided on the opposite side of the control circuit board with respect to the bottom wall of the housing while fixedly supporting the control circuit board in the housing by the bolt member.

In the above case, providing an arrangement in which the heat transfer layer on the control circuit board includes an extension that is attached to an inner surface of the bolt insertion hole and to a bottom surface of a head portion of the bolt member enables to transfer the heat in the heat transfer layer to the bolt member efficiently.

This application is based on patent application No. 2001-101094 filed in Japan, the contents of which are hereby incorporated by references.

As this invention may be embodied in several forms without departing from the spirit of essential characteristics thereof, the present embodiment is therefore illustrative an not restrictive, since the scope of the invention is defined by the appended claims rather than by the description preceding them, and all changes that fall within metes and bounds of the claims, or equivalence of such metes and bounds are therefore intended to embraced by the claims.

What is claimed is:

1. An electric power distributor to be mounted on a motor vehicle for distributing electric power from a power source installed in the motor vehicle to a plurality of electric load units equipped in the motor vehicle, the power electric distributor comprising:

a plurality of semiconductor operative elements which are incorporated in a power supply circuit from the power source to the electric load units;

a control circuit board including a control circuit for controlling operation of the semiconductor operative elements, the control circuit board being disposed to cover the plurality of semiconductor operative elements with a space between the control circuit board and the semiconductor operative elements;

a heat transfer layer attached to the control circuit board on a side of the control circuit board facing the semiconductor operative elements;

a housing for enclosing the semiconductor operative elements and the control circuit board;

a heat releasing member attached to the semiconductor operative elements and exposed to outside of the housing to release heat caused on the semiconductor operative elements; and a heat transfer member heat-conductively connected between the heat transfer layer and the heat releasing member to transfer heat received by the heat transfer layer to the heat releasing member.

2. The electric power distributor according to claim 1, wherein the heat releasing member is disposed on a side of the semiconductor operative elements opposite a side facing the control circuit board.

3. The electric power distributor according to claim 1, wherein the plurality of semiconductor operative elements are arranged substantially on a plane, and the heat releasing member and the control circuit board are arranged substantially in parallel to the plane.

4. The electric power distributor according to claim 1, wherein the heat transfer member includes a metallic bolt member that fixedly mounts the control circuit board on the housing, and is in contact with the heat transfer layer and the heat releasing member.

5. The electric power distributor according to claim 4, wherein the control circuit board is formed with a bolt receiving hole through which the bolt member passes, and the bolt member is fastened to the heat releasing member.

6. The electric power distributor according to claim 5, wherein the heat transfer layer extends to a wall which defines the bolt receiving hole, to be in contact with the bolt member when the latter is inserted in the hole.

7. The electric power distributor according to claim 6, wherein the heat transfer layer extending to the wall comprises a further extending portion which further extends to a side of the control circuit board opposite the side facing the semiconductor operative elements, such that a head of the bolt member is in contact with the further extending portion of the heat transfer layer.

8. The electric power distributor according to claim 5, wherein the housing is formed with a plurality of board supporting pins each of which is formed with a through hole, the bolt member extending through a through hole of a board supporting pin, and each board supporting pin having a length for spacing the control circuit board from the semiconductor operative elements.

9. The electric power distributor according to claim 5, wherein the heat transfer layer is formed on an substantially entire area of the control circuit board on the side of the control circuit board facing the semiconductor operative elements.

* * * * *